United States Patent
Song et al.

(10) Patent No.: US 8,861,264 B2
(45) Date of Patent: Oct. 14, 2014

(54) MEMORY DEVICE, PRECHARGE CONTROLLING METHOD THEREOF, AND DEVICES HAVING THE SAME

(75) Inventors: Ick Hyun Song, Seoul (KR); Ki Whan Song, Yongin-si (KR); Jin-Young Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 13/178,993

(22) Filed: Jul. 8, 2011

(65) Prior Publication Data

US 2012/0033489 A1   Feb. 9, 2012

(30) Foreign Application Priority Data

Aug. 3, 2010   (KR) .................. 10-2010-0074894

(51) Int. Cl.
    G11C 11/00   (2006.01)
    G11C 13/00   (2006.01)
    G11C 8/08    (2006.01)
    G11C 7/12    (2006.01)

(52) U.S. Cl.
    CPC ............. *G11C 7/12* (2013.01); *G11C 13/004* (2013.01); *G11C 8/08* (2013.01); *G11C 13/0004* (2013.01); *G11C 13/0026* (2013.01); *G11C 13/0007* (2013.01)

USPC ...... 365/163; 365/185.25; 365/203; 365/204; 365/230.03

(58) Field of Classification Search
    CPC .......... G11C 7/12; G11C 7/22; G11C 7/1048; G11C 11/4091; G11C 11/4094
    USPC ........ 365/149, 163, 203, 204, 185.25, 230.03
    See application file for complete search history.

(56) References Cited

U.S. PATENT DOCUMENTS

| | | | | |
|---|---|---|---|---|
| 5,349,560 | A * | 9/1994 | Suh et al. | 365/203 |
| 6,829,186 | B2 * | 12/2004 | Kanno et al. | 365/203 |
| 6,909,656 | B2 * | 6/2005 | Moore et al. | 365/222 |
| 7,609,571 | B2 * | 10/2009 | Kim | 365/205 |
| 2005/0213404 | A1 * | 9/2005 | Kodama | 365/203 |
| 2008/0117699 | A1 * | 5/2008 | Kim | 365/205 |

FOREIGN PATENT DOCUMENTS

| | | | |
|---|---|---|---|
| JP | 61-126683 A | | 6/1986 |
| JP | 2007-157317 A | | 6/2007 |
| JP | 2007-234133 A | | 9/2007 |
| KR | 10-2009-0110494 A | | 10/2009 |

* cited by examiner

*Primary Examiner* — Thao H Bui
(74) *Attorney, Agent, or Firm* — Sughrue Mion, PLLC

(57) ABSTRACT

A pre-charge controlling method and device are provided. The pre-charge controlling method includes pre-charging a first global bit line with a first pre-charge voltage by using at least a first pre-charge circuit located between a plurality of sub arrays included in a memory cell array and pre-charging the first global bit line with a second pre-charge voltage by using a second pre-charge circuit located outside the memory cell array.

20 Claims, 19 Drawing Sheets

MEMORY DEVICE, PRECHARGE CONTROLLING METHOD THEREOF, AND DEVICES HAVING THE SAME

CROSS-REFERENCE TO RELATED APPLICATION

This application claims priority from Korean Patent Application No. 10-2010-74894 filed on Aug. 3, 2010, the disclosure of which is hereby incorporated by reference in its entirety.

BACKGROUND

Methods and apparatuses consistent with the exemplary embodiments relate to a memory device, and more particularly, to a memory device which may reduce the pre-charge time of a global bit line by arranging a pre-charge circuit between sub-arrays, a pre-charge controlling method thereof, and devices having the same.

Semiconductor memory devices are memory devices which may store and read data when necessary. Semiconductor memory devices are primarily divided into volatile memory devices and non-volatile memory devices.

Volatile memory devices include dynamic random access memory (DRAM) and static RAM (SRAM) and so on. Non-volatile memory devices include programmable read only memory (PROM), erasable PROM (EPROM), an electrically erasable PROM (EEPROM), flash memory, ferroelectric RAM (FRAM) using a ferroelectric capacitor, magnetic RAM (MRAM) using a Tunneling magneto-resistive (TMR) film, and phase change RAM (PRAM) using chalcogenide alloys. The PRAM has a relatively simple manufacturing process and may realize large memory capacity at a low price.

SUMMARY

One or more exemplary embodiments provide a pre-charge method which may reduce the pre-charge time of global bit lines by arranging a pre-charge circuit between sub-arrays included in a memory cell array and reducing the resistance-capacitance (RC) delay of the global bit lines, and devices performing the method.

According to an aspect of an exemplary embodiment, there is provided a global bit line pre-charge method of a memory device, including pre-charging a selected global bit line with a first pre-charge voltage by using at least a first pre-charge circuit located between a plurality of sub-arrays included in a memory cell array, and pre-charging the selected global bit line with a second pre-charge voltage by using a second pre-charge circuit located outside the memory cell array.

The pre-charging with the first pre-charge voltage may supply an external voltage to the selected bit line as the first pre-charge voltage by using the first pre-charge circuit.

The step of pre-charging with the first pre-charge voltage may pre-charge the selected global bit line with the first pre-charge voltage by clamping a current occurred by an external power supply and supplying a clamped current to the selected global bit line by using the first pre-charge circuit.

The step of pre-charging with the second pre-charge voltage may supply a voltage that the first pre-charge voltage is regulated to the selected global bit line as the second pre-charge voltage by using the second pre-charge circuit.

According to an aspect of an exemplary embodiment, there is provided a memory device, including a memory cell array including a plurality of sub-arrays, at least a first pre-charge circuit embodied inside the memory cell array that pre-charges a selected global bit line among a plurality of global bit lines with a first pre-charge voltage, and a second pre-charge circuit embodied outside the memory cell array that pre-charges the selected global bit line with a second pre-charge voltage.

The first pre-charge circuit may be arranged between the plurality of sub-arrays, or at a top or a bottom of the plurality of sub-arrays.

The first pre-charge circuit may supply an external voltage to the global bit line as the first pre-charge voltage, and the second pre-charge circuit may supply a voltage that the external voltage is regulated to the selected global bit line as the second pre-charge voltage.

The first pre-charge circuit may clamp a current supplied from an external power supply and may pre-charge the selected global bit line with the first pre-charge voltage by using a clamped current, and the second pre-charge circuit may clamp a current supplied from a regulator connected to the external power supply and may pre-charge the selected global bit line with the second pre-charge voltage by using a clamped current.

The memory device may further include a control logic controlling the first pre-charge circuit and the second pre-charge circuit so that the second pre-charge voltage may be supplied to the selected global bit line after the first pre-charge voltage is supplied to the selected global bit line.

The first pre-charge circuit may include a first pre-charge voltage supply circuit outputting the first pre-charge voltage in response to a first pre-charge enable signal and a first clamp circuit for clamping a current, which is supplied to the selected global bit line from the first pre-charge voltage supply circuit, according to a clamp control signal.

The second pre-charge circuit may include a second pre-charge voltage supply circuit outputting the second pre-charge voltage in response to a second pre-charge enable signal and a second clamp circuit for clamping a current, which is supplied to the selected global bit line from the second pre-charge voltage supply circuit, according to the clamp control signal.

The memory device may be embodied in a phase change memory device.

According to an aspect of another exemplary embodiment, there is provided an electronic device, including the same memory device and a processor for controlling an operation of the memory device.

The electronic device may be embodied in a personal computer (PC), a tablet PC, a solid state drive (SSD) or a mobile phone.

According to an aspect of another exemplary embodiment, there is provided a memory card, including a card interface, the said memory device, and a memory controller for controlling data exchange between the card interface and the memory device.

According to another aspect of an exemplary embodiment, there is provided a three-dimensional memory device, including a plurality of layers, a memory cell array which is embodied on each of the plurality of layers and includes a plurality of sub-arrays, at least a first pre-charge circuit embodied inside the memory cell array and that pre-charges a selected global bit line among a plurality of global bit lines with a first pre-charge voltage, and a second pre-charge circuit embodied outside the memory cell array and that pre-charges the selected global bit line with a second pre-charge voltage.

The first pre-charge circuit may clamp a current supplied from an external power supply and may pre-charge the selected global bit line with the first pre-charge voltage by using a clamped current, and the second pre-charge circuit may clamp a current supplied from a regulator and may pre-charge the selected global bit line with the second pre-charge voltage by using a clamped current.

According to an aspect of another exemplary embodiment, there is provided an electronic device, including the three-dimensional memory device and a processor for controlling an operation of the three-dimensional memory device.

According to an aspect of another exemplary embodiment, there is provided a data storage device, including a plurality of memory systems which comprises a redundant array of independent disks (RAID) and includes a memory controller for controlling an operation of the plurality of memory devices, respectively, and a RAID controller for controlling an operation of each of the plurality of memory systems.

Each of the plurality of memory devices may include a memory cell array including a plurality of sub-arrays, at least a first pre-charge circuit embodied inside the memory cell array and that pre-charges a selected global bit line among a plurality of global bit lines with a first pre-charge voltage, and a second pre-charge circuit embodied outside the memory cell array and that pre-charges the selected global bit line with a second pre-charge voltage.

According to an aspect of another exemplary embodiment, there is provided a semiconductor device, including a volatile memory device including a memory cell array including a plurality of DRAM cells, a non-volatile memory device including a memory cell including a plurality of PRAM cells, and a DRAM interface for controlling data communication between one of the volatile memory device and the non-volatile memory device and a host according to a DRAM protocol.

The non-volatile memory device may include a memory cell array including a plurality of sub arrays, at least a first pre-charge circuit embodied inside the memory cell array and that pre-charges a selected global bit line among a plurality of global bit lines with a first pre-charge voltage, and a second pre-charge circuit embodied outside the memory cell array and that pre-charges the selected global bit line with a second pre-charge voltage.

The first pre-charge circuit may clamp a current supplied from an external power supply and may pre-charge the selected global bit line with the first pre-charge voltage by using a clamped current. The second pre-charge circuit may clamp a current supplied from a regulator connected to the external power supply and may pre-charge the selected global bit line with the second pre-charge voltage by using a clamped current.

The semiconductor device may be embodied in a multi-chip package.

According to another aspect of an exemplary embodiment, there is provided a semiconductor system including the semiconductor device and a controller for controlling an operation of the semiconductor device.

BRIEF DESCRIPTION OF THE DRAWINGS

These and/or other aspects of the present general inventive concept will become apparent and more readily appreciated from the following description of the exemplary embodiments, taken in conjunction with the accompanying drawings of which.

DETAILED DESCRIPTION OF THE EXEMPLARY EMBODIMENTS

Figure 1:
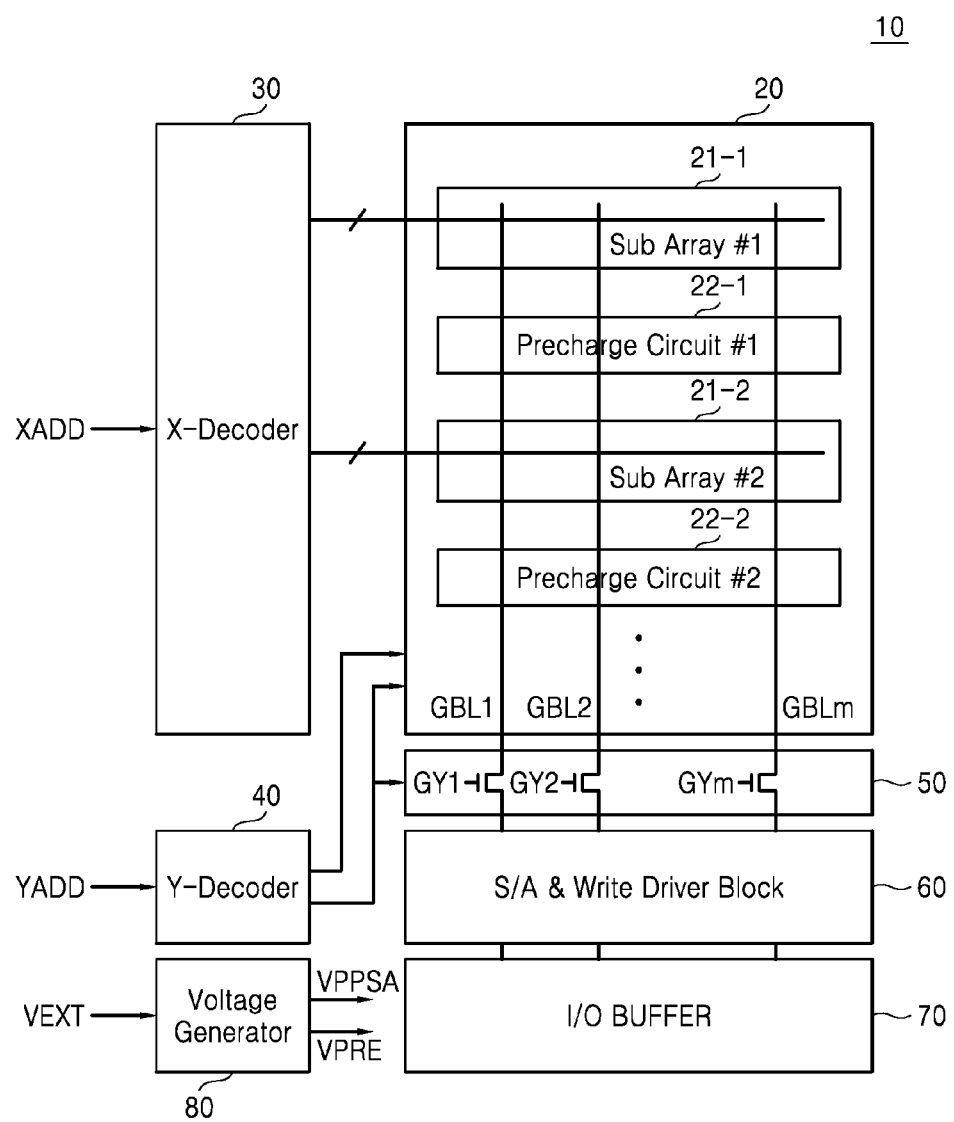
FIG. 1 shows a block diagram of a memory device according to an exemplary embodiment.

Reference will now be made in detail to the following exemplary embodiments, which are illustrated in the accompanying drawings, wherein like reference numerals refer to the like elements throughout. The exemplary embodiments are described below in order to explain the present general inventive concept by referring to the figures.

FIG. 1 shows a block diagram of a memory device according to an exemplary embodiment. The memory device illustrated in FIG. 1 may be a semiconductor device, which may perform a method of pre-charging a global bit line by using a pre-charge circuit arranged inside a memory cell array, and includes a volatile memory device and a non-volatile memory device.

The volatile memory device includes a DRAM, an SRAM, a Thyristor RAM (TRAM), a zero capacitor RAM (Z-RAM) or a Twin Transistor RAM (TTRAM). The non-volatile memory device includes an EEPROM, a flash memory, an FRAM, an MRAM, a PRAM, a resistive random-access memory (RRAM) or a Nano-RAM (NRAM).

The exemplary embodiment takes a non-volatile memory device, e.g., a PRAM, as an example for convenience of explanation, however, the inventive concept may be applied to a volatile memory device or a non-volatile memory device.

Referring to FIG. 1, a non-volatile memory device 10 includes a memory cell array 20 which may be a two-dimensional array or a three-dimensional array, a row decoder 30, a column decoder 40, a Y-gating circuit 50, a sense amplifier (S/A) & write driver block 60, an input/output buffer 70, and a voltage generator 80.

A two dimensionally-embodied memory cell array 20 includes a plurality of sub arrays 21-1, 21-2, . . . , and a plurality of first pre-charge circuits 22-1, 22-2, . . . .

In each of the plurality of sub arrays 21-1, 21-2, . . . , a plurality of memory cells, a plurality of word lines, a plurality of local bit lines, and a plurality of global bit lines GBL1 to GBLm are embodied.

During a pre-charge operation, each of the plurality of first pre-charge circuits 22-1, 22-2, . . . may pre-charge at least one of the plurality of global bit lines GBL1 to GBLm, where m is a natural number, with a first pre-charge voltage VEXT.

Each of the plurality of first pre-charge circuits 22-1, 22-2, . . . may be arranged between two corresponding sub arrays among the plurality of sub arrays 21-1, 21-2, . . . . Each arrangement of the plurality of first pre-charge circuit 22-1, 22-2, . . . may be changed variously inside a memory cell array according to a circuit design. FIG. 1 illustrates that each of the plurality of first pre-charge circuits 22-1, 22-2, . . . is arranged between a plurality of sub arrays 21-2, 21-2, . . . , however it is not restricted thereto.

The row decoder 30 may decode row addresses XADD output from a control logic (not shown) and drive one of a plurality of word lines embodied in the memory cell array 20 selectively according to a decoding result.

The column decoder 40 may decode column addresses YADD output from the control logic (not shown) and output a plurality of local bit line selection signals and a plurality of global bit line selection signals GY1 to GYm according to a decoding result.

The Y-gating circuit 50 includes a plurality of switching circuits. Each of the plurality of switching circuits may be embodied in a metal-oxide-semiconductor (MOS) transistor.

Each of the plurality of switching circuits may control the connection between each of the plurality of global bit line GBL1 to GBLm and a sense amplifier & write driver block 60 in response to each of the plurality of global bit line selection signals GY1 to Gym.

During a write operation, the sense amplifier & write driver block 60 may supply write data output from an input/output buffer 70 to at least one of the plurality of global bit lines GBL1 to GBLm through the Y-gating circuit 50.

In addition, during a read operation, the sense amplifier & write driver block 60 may sense and amplify a read data output through one of the plurality of global bit lines GBL1 to GBLm and the Y-gating circuit 50.

The input/output buffer 70 may transmit write data input through a data bus to the sense amplifier & write driver block 60 or transmit read data output from the sense amplifier & write driver block 60 to the data bus.

The voltage generator 80 may generate at least one operational voltage necessary for an operation of the memory cell array 20, the row decoder 30, the column decoder 40 or the sense amplifier & write driver block 60.

The voltage generator 80 may receive an external voltage VEXT, which may be used as a first pre-charge voltage, and generate a voltage (VPPSA) higher than the external voltage VEXT by pumping a received external voltage VEXT output from a external power supply. The voltage VPPSA may be used as a third pre-charge voltage.

Moreover, the voltage generator 80 may regulate the external voltage VEXT and output a regulated voltage VPRE. The regulated voltage VPRE may be used as a second pre-charge voltage. In this case, the voltage generator 80 may include a regulator (not shown) that regulates the external voltage VEXT output from an external power supply and generates the regulated voltage VPRE.

Figure 2:
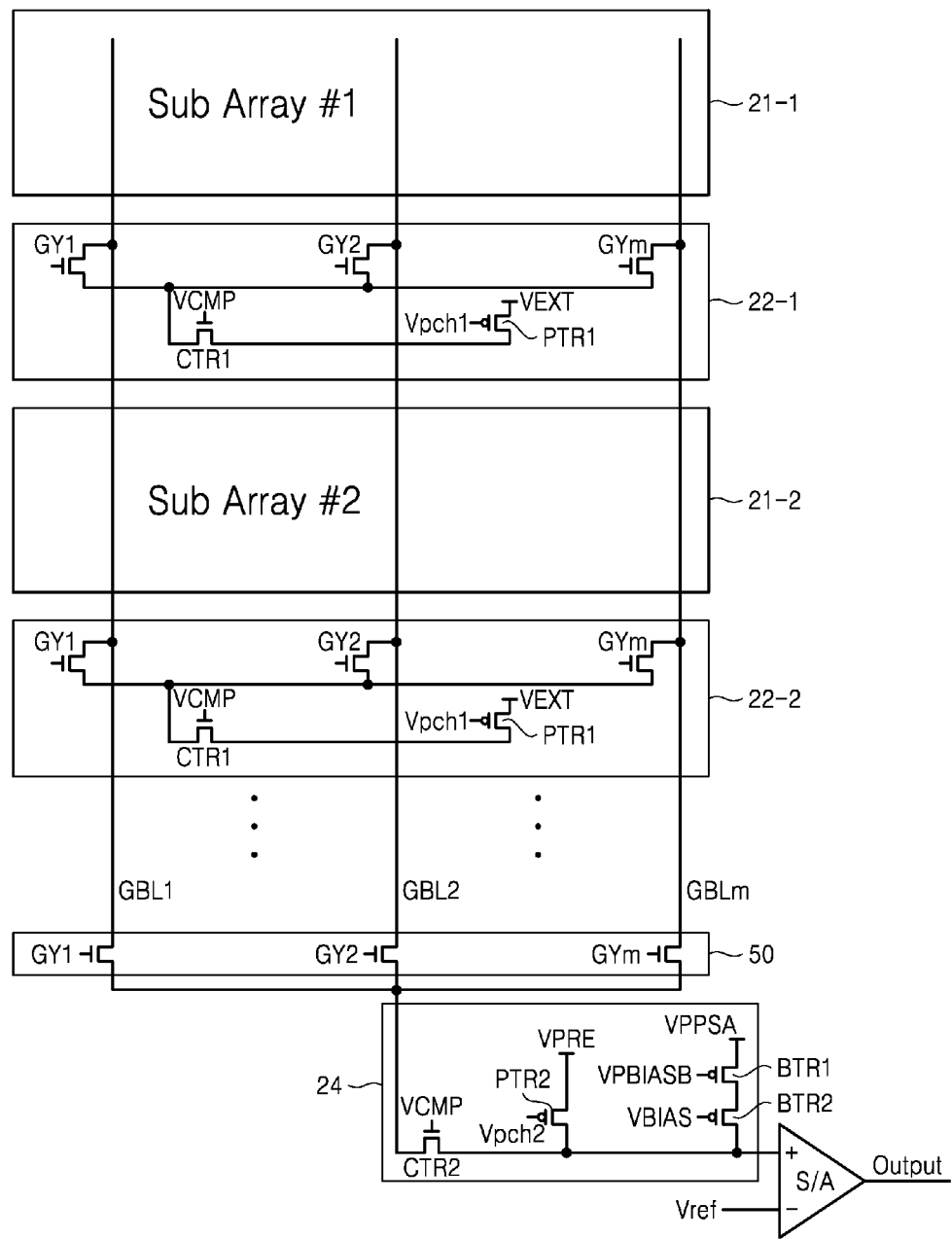
FIG. 2 shows a detailed diagram of a memory cell array, a Y-gating circuit and a sense amplification circuit illustrated in FIG. 1.
Figure 3:
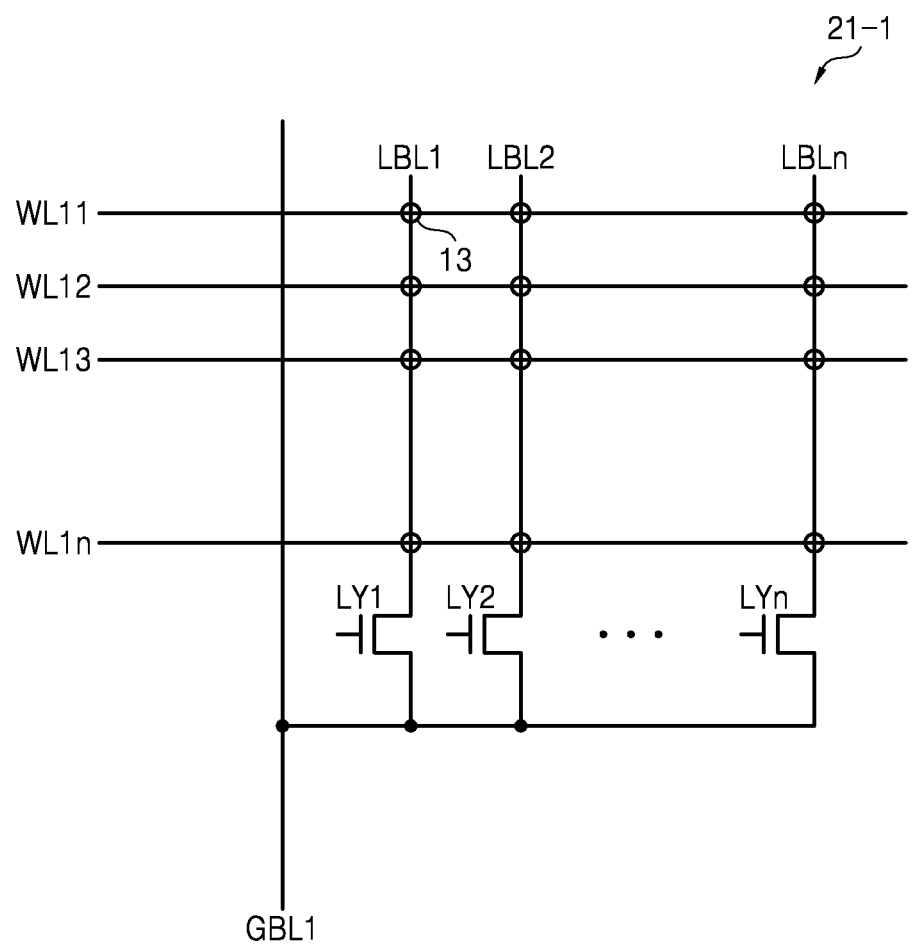
FIG. 3 shows a first sub-array in detail, which is included in the memory cell array illustrated in FIGS. 1 and 2.

FIG. 2 shows a detailed diagram of a memory cell array 20, a Y-gating circuit 50, and a sense amplification circuit 60 illustrated in FIG. 1, and FIG. 3 shows a first sub array 21-1 included in the memory cell array 20 illustrated in FIGS. 1 and 2 in detail.

Referring to FIGS. 1 to 3, a first sub array 21-1 includes a plurality of word lines WL11 to WL1n, a plurality of local bit lines LBL1 to LBLn, and a plurality of memory cells 13. Each of the plurality of memory cells 13 is connected to one of the plurality of word lines WL11 to WL1n and one of the plurality of local bit lines LBL1 to LBLn.

For convenience of explanation, FIG. 3 illustrates a first sub array 21-1 and a plurality of switching circuits together.

Each of the plurality of switching circuits may connect one of the plurality of local bit lines LBL1 to LBLn with a first global bit line GBL1 according to a plurality of local bit line selection signals LY1 to LYn output from the column decoder 40. For example, the plurality of local bit line selection signals LY1 to LYn do not turn on more than one of the switching circuits at the same time.

The structure of each sub array of the plurality of sub arrays 21-1, 21-2, . . . illustrated in FIGS. 1 and 2 may be substantially the same as a structure of a first sub array 21-1.

Each of the first pre-charge circuits 22-1, 22-2, . . . may be connected to each of the plurality of global bit lines GBL1 to GBLm through each of a plurality of switching circuits. Each of the plurality of switching circuits is switched according to a corresponding global bit line selection signal of the plurality of global bit line selection signals GY1 to GYm.

The structure of each pre-charge circuit of the plurality of first pre-charge circuits 22-1, 22-2, . . . may be equal to each other.

A pre-charge circuit 22-1 includes a first pre-charge voltage supply circuit PTR1, a first clamping circuit CTR1, and a plurality of switching circuits.

The first pre-charge voltage supply circuit PTR1 may supply a first pre-charge voltage VEXT to a first clamp circuit CTR1 in response to a first pre-charge enable signal Vpch1. A PMOS transistor is illustrated as the first pre-charge voltage supply circuit PTR1 in FIG. 2.

The first clamp circuit CTR1 may clamp a current supplied to a common node of the plurality of switching circuits, e.g., a current output from the first pre-charge voltage supply circuit PTR1, according to a clamping control signal VCMP. For example, the first clamp circuit CTR1 may clamp a current supplied to the common node from the first pre-charge voltage supply circuit PTR1 according to a level of the clamp control signal VCMP. An NMOS transistor is illustrated as an example of the first clamp circuit CTR1 in FIG. 2.

Each of the plurality of switching circuits may supply a current output from the first clamp circuit CTR1 to each of the plurality of global bit lines GBL1 to GBLm in response to a corresponding global bit line selection signal of the plurality of global bit line selection signals GY1 to GYm. Accordingly, each of the plurality of global bit lines GBL1 to GBLm may be pre-charged with a first pre-charge voltage VEXT selectively.

As the pre-charge circuit 22-1 is arranged between the plurality of sub arrays 21-1 and 21-2, RC-delay of each of the plurality of global bit lines GBL1 to GBLm gets decreased. Subsequently, pre-charge time for pre-charging at least one of the plurality of global bit lines GBL1 to GBLm with a first pre-charge voltage VEXT gets decreased.

As the pre-charge time decreases, the memory device 10 of the exemplary embodiment may reduce row address to column address delay (tRCD), and may also reduce sensing time for sensing data of a selected memory cell and reduce data reading time.

As the number of the plurality of first pre-charge circuits 22-1, 22-2, . . . arranged between the plurality of sub arrays 21-1, 21-2, . . . increases, the RC-delay of the plurality of global bit lines GBL1 to GBLm is further decreased. Accordingly, the memory device 10 may reduce the amount of time needed for pre-charging the selected global bit line with a first pre-charge voltage VEXT. Therefore, the memory device 10 of the exemplary embodiment may further reduce a tRCD and sensing time.

The sense amplifier & write driver block 60 includes a plurality of sense amplification circuits (not shown). A plurality of global bit lines may be connected to each of the plurality of sense amplification circuits. For convenience of explanation, FIG. 2 illustrates an example in which each of the plurality of global bit lines GBL1 to GBLm is connected to a sense amplification circuit, however, it is not restricted thereto.

The sense amplification circuit includes a second pre-charge circuit 24 and a sense amplifier S/A.

After a selected one of the plurality of global bit lines GBL1 to GBLm is pre-charged with a first pre-charge voltage VEXT by each of the plurality of first pre-charge circuits 22-1, 22-2, . . . , the second pre-charge circuit 24 may pre-charge the selected global bit line with a second pre-charge voltage VPRE in response to a second pre-charge enable signal Vpch2. For example, a first pre-charge voltage VEXT may be an unstable voltage and a second pre-charge voltage VPRE may be a stable voltage.

The selected global bit line is pre-charged with the second pre-charge voltage VPRE after being pre-charged with the first pre-charge voltage VEXT, so that the pre-charge time needed for pre-charging the selected global bit line may be reduced. Accordingly, tRCD and sensing time are reduced.

The control logic may control each pre-charge enable signal Vpch1 and Vpch2.

The second pre-charge circuit 24 includes a second pre-charge voltage supply circuit PTR2 and a second clamp circuit CTR2. The second pre-charge voltage supply circuit PTR2 supplies the second pre-charge voltage VPRE to the second clamp circuit CTR2 in response to a second pre-charge enable signal Vpch2.

The second clamp circuit CTR2 may clamp a current supplied to a common node between a plurality of switching circuits according to a clamp control signal VCMP. For example, the second clamp circuit CTR2 may clamp a current supplied to the common node from the second pre-charge voltage supply circuit PTR2, according to a level of a clamp control signal VCMP.

The second pre-charge circuit 24 may further include a third pre-charge voltage supply circuit for supplying a third pre-charge voltage VPPSA necessary for performing a developing operation. The third pre-charge voltage supply circuit may supply the third pre-charge voltage VPPSA to a selected global bit line connected to a local bit line connected to a selected memory cell.

For convenience of explanation, FIG. 2 illustrates a plurality of transistors BTR1 and BTR2 connected in series between a power source line supplying the third pre-charge voltage VPPSA and a first input terminal (+) of the sense amplifier S/A. The third pre-charge voltage VPPSA is a higher voltage than the first pre-charge voltage VEXT and the second pre-charge voltage VPRE.

The sense amplifier S/A senses and amplifies difference between a voltage of a first input terminal (+) and a reference voltage Vref supplied to a second input terminal (−) and outputs an output signal.

A memory cell 13 illustrated in FIG. 3 is a memory cell storing data by using a phase change material such as Ge—Sb—Te (GST), and includes a memory element and a select element. The phase change material has one of two stable states, i.e., a crystal state and an amorphous state, depending on temperature.

Figure 4:
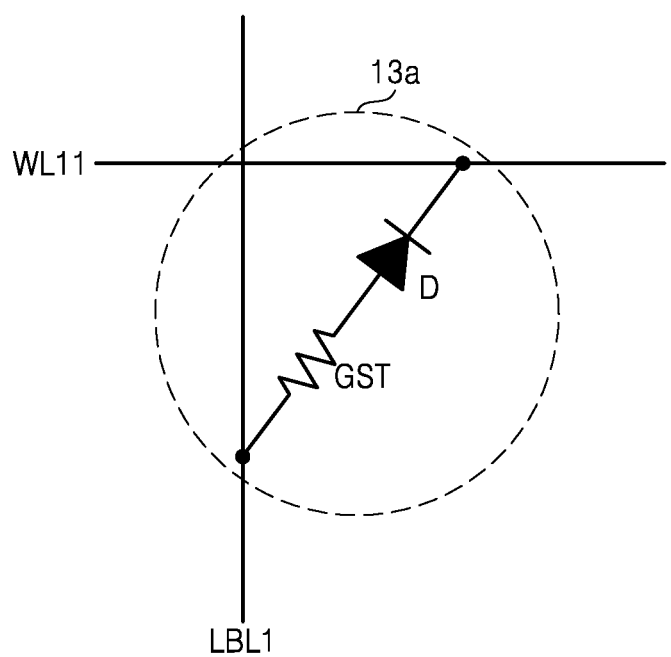
FIG. 4 shows an exemplary embodiment of a memory cell illustrated in FIG. 3.

FIG. 4 shows an exemplary embodiment of the memory cell 13 illustrated in FIG. 3. A non-volatile memory cell is illustrated as a memory cell 13a, which is included in the memory cell array 20 illustrated in FIG. 1. Memory cell 13a includes a memory element GST and a select element D which are connected in series between a local bit line LBL1 and a word line WL11. Here, a phase change material (GST) is used as a memory element and a diode D is used as a selection element.

That is, an anode of the diode D is connected to the memory element GST and cathode of the diode D is connected to a word line WL11. For example, when a voltage difference between the anode and the cathode of the diode D is higher than a threshold voltage of the diode D, the memory element GST of the non-volatile memory device 13a may be supplied with a program current, e.g., a set current or a rest current, through a bit line LBL1.

Figure 5:
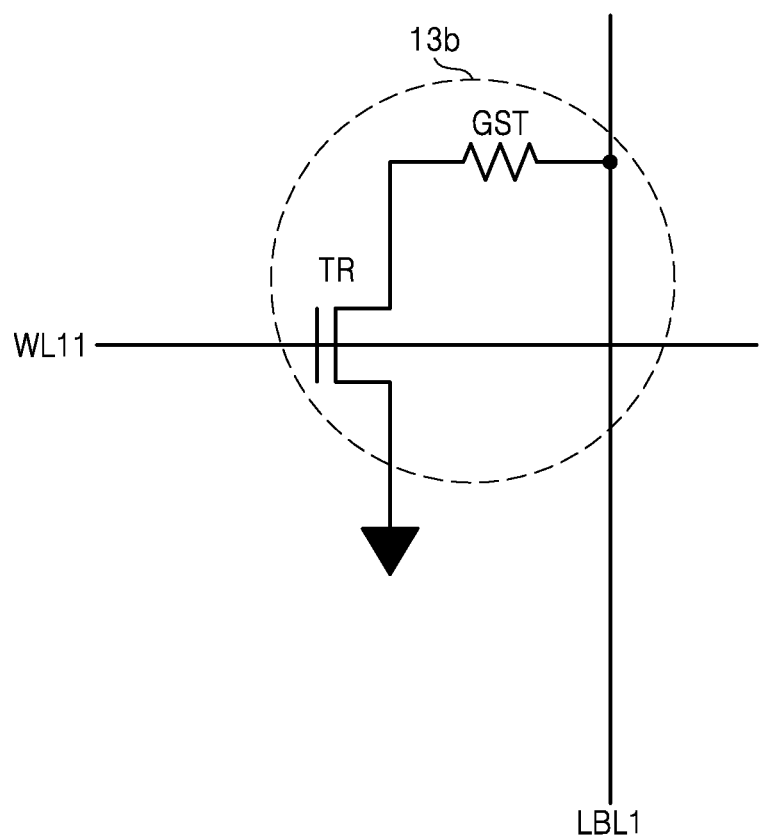
FIG. 5 shows an exemplary embodiment of the memory cell illustrated in FIG. 3.

FIG. 5 shows another exemplary embodiment of the memory cell 13 illustrated in FIG. 3. FIG. 5 illustrates a non-volatile memory cell 13b, which includes a memory element GST and a select element TR connected in series between a local bit line LBL1 and a supply line, e.g., a ground line supplying a ground voltage or a supply line supplying a constant voltage. Here, the phase change material GST is used as the memory element and a transistor TR is used as the select element.

For example, when a voltage supplied to a word line WL11 is higher than a threshold voltage of the transistor TR, a memory element GST of a non-volatile memory cell 13b may be supplied with a program current, e.g., a set current or a reset current, through a local bit line LBL1.

Figure 6:
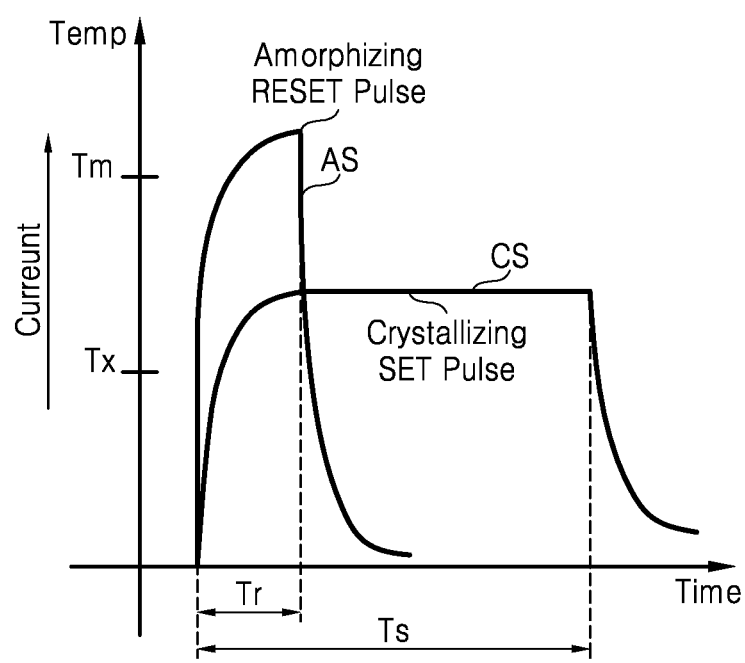
FIG. 6 is a graph for explaining property of a phase change material illustrated in FIGS. 4 and 5.

FIG. 6 is a graph for explaining a property of a phase change material illustrated in FIGS. 4 and 5. Referring to FIG. 6, AS means a condition, e.g., a current, in which the phase change material GST illustrated in FIGS. 4 and 5 is in an amorphous state, and CS means a condition, e.g., a current, in which the phase change material GST illustrated in FIGS. 4 and 5 is in a crystal state.

As illustrated in FIGS. 4 to 6, a phase change material GST transitions to an amorphous state when it is heated to a temperature which is higher than a melting temperature Tm and rapidly quenched by a current AS supplied through a local bit line LBL1 during time Tr.

The phase change material GST transitions to a crystal state when it is heated to a temperature which is lower than the melting temperature Tm and higher than a crystallization temperature Tx and slowly quenched by a current AS supplied through a local bit line LBL1 during time Ts, which is longer than the time Tr.

The resistance of a non-volatile memory cell 13, 13a and 13b when the phase change material GST is in an amorphous state is greater than the resistance of the non-volatile memory cell 13, 13a and 13b when the phase change material GST is in a crystal state. Therefore, the phase change material GST may store data by using such a resistance difference.

The amorphous state may be called a rest state, which corresponds to storing data '1', and the crystal state may be called a set state, which corresponds to storing data '0'. Of course, depending on how to define a reset state and a set state, it may be defined that data '0' is stored in a reset state and data '1' is stored in a set state.

Figure 7:
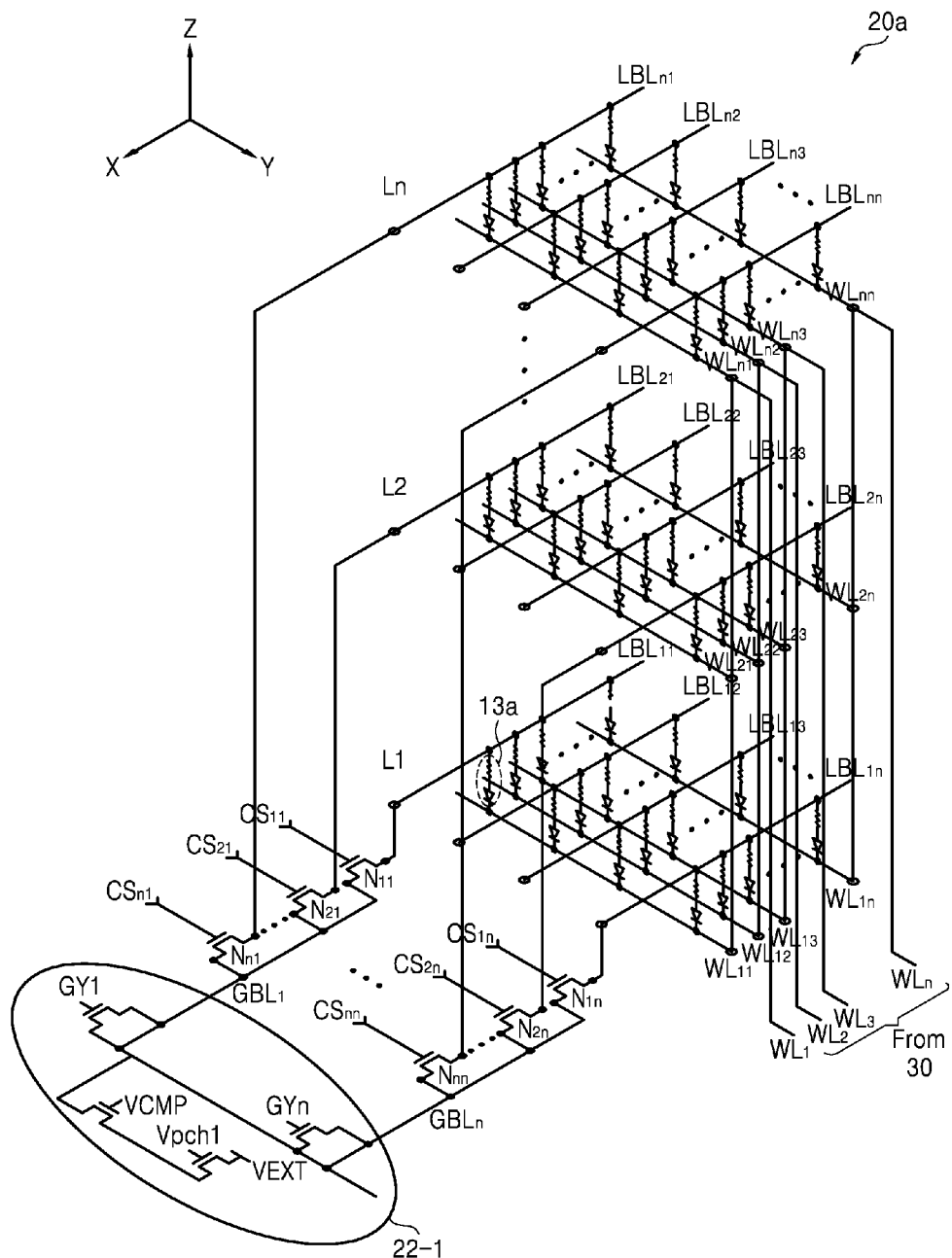
FIG. 7 shows the memory cell array illustrated in FIG. 1, which is three dimensionally embodied.

FIG. 7 shows the memory cell array illustrated in FIG. 1, which is three dimensionally embodied.

Referring to FIGS. 1 and 7, the memory device 10 may include a three-dimensionally embodied memory cell array 20a. A memory cell array 20a includes a plurality of layers L1 to Ln. The plurality of layers L1 to Ln may be embodied in a wafer-typed stack, a chip-typed stack or a cell stack. The layers may be electrically connected by a silicon via (TSV), a wire bonding or a bump.

A first layer L1 includes a plurality of word lines WL11 to WL1n, a plurality of local bit lines LBL11 to LBL1n, and a plurality of non-volatile memory cells 13a. A second layer L2 includes a plurality of word lines WL21 to WL2n, a plurality of local bit lines LBL21 to LBL2n, and a plurality of non-volatile memory cells. A $n^{th}$ layer Ln includes a plurality of word lines WLn1 to WLnn, a plurality of local bit lines LBLn1 to LBLnn, and a plurality of non-volatile memory cells.

As illustrated in FIG. 7, each word line WL11-WL1n . . . WLn1-WLnn embodied on each layer L1 to Ln may be connected to each other. For example, as illustrated in FIGS. 1 and 7, each word line WL11, WL21, . . . , WLn1 may compose a word line WL1 by being connected to each other and each word line WL1n, WL2n, . . . , WLnn may compose a word line WLn by being connected to each other. Accordingly, a row decoder 30 may drive each word line WL1 to WLn selectively.

Each first local bit line LBL11 to LBLn1 embodied on each layer L1 to Ln may be connected to a first global bit line GBL1 through respective first selection switches N11, N21, . . . , Nn1. Each of the first selection switches N11, N21, . . . , Nn1 may be switched according to respective selection signal CS11, CS21, . . . , CSn1 output from a column decoder 40.

Each $n^{th}$ local bit line LBL1n to LBLnn embodied on each layer L1 to Ln may be connected to each selection global bit line GBLn output from the column decoder 40 through each $N^{th}$ selection switch N1n, N2n, . . . , Nnn. Each of the $n^{th}$ selection switches N1n, N2n, . . . , Nnn may be switched according to each selection signal CS1n, CS2m, . . . , CSnn output from the column decoder 40.

The first pre-charge circuit 22-1 may pre-charge each global bit line GBL1 to GBLn with a first pre-charge voltage VEXT in response to each global bit line selection signal GY1 to GYn. The first re-charge circuit 22-1 illustrated in FIG. 7 is arranged between sub arrays of each memory cell array embodied on each layer L1 to Ln.

FIG. 7 illustrates the first pre-charge circuit 22-1 separated from each layer L1 to Ln for convenience of explanation, however, an embodiment of the first pre-charge circuit 22-1 of FIG. 7 is substantially the same as one of the first pre-charge circuit 22-1 of FIG. 2.

Figure 8:
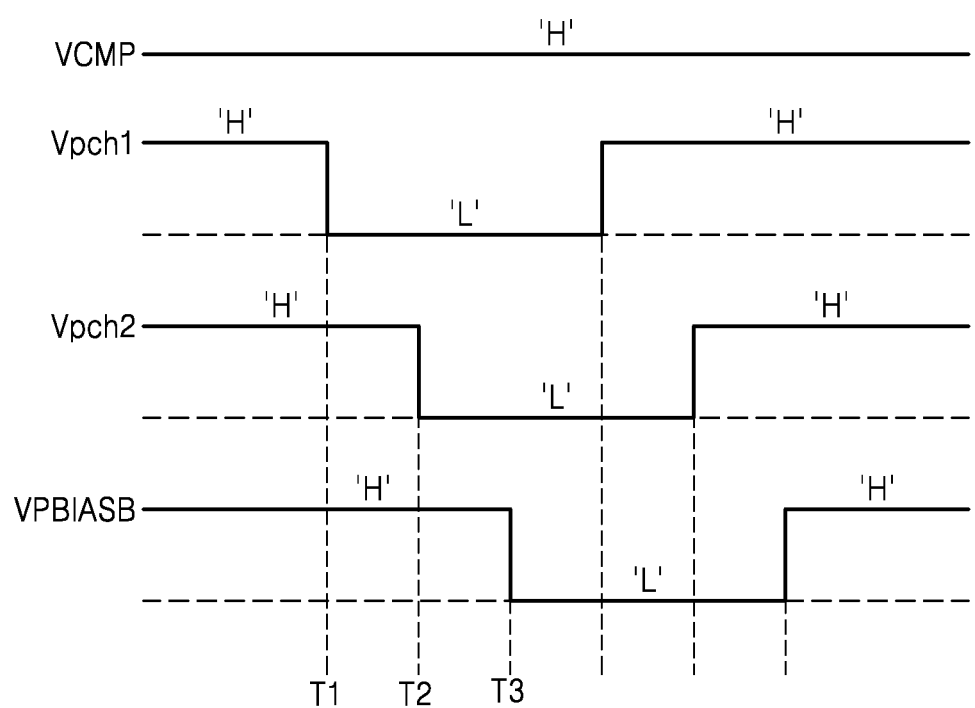
FIG. 8 shows waveforms of control signals supplied to each pre-charge circuit illustrated in FIG. 2.

FIG. 8 shows waveforms of control signals supplied to each pre-charge circuit illustrated in FIG. 2. When a first global bit line GBL1 is selected among the plurality of global bit lines GBL1 to GBLm, a pre-charge operation for the first global bit line GBL1 is explained in detail referring to FIGS. 2 to 8.

Referring to FIGS. 2 and 8, a clamping control signal VCMP retains a high level before T1 and a first pre-charge enable signal Vpch1 transfers from a high level H to a low level L at T1. Accordingly, a first pre-charge supply voltage circuit PTR1 of each of a plurality of first pre-charge circuits 22-1, 22-2, . . . , arranged between a plurality of sub arrays 21-1, 21-2, . . . supplies a first pre-charge voltage VEXT to the first global bit line GBL1 through a turned-on first clamping circuit CTR1.

A second pre-charge enable signal Vpch2 transfers from a high level H to a low level L at T2. Accordingly, a second pre-charge voltage supply circuit PTR2 of a second pre-charge circuit 24 supplies a second pre-charge voltage VPRE to a first global bit line GBL1 through a turned-on second clamping circuit CTR2.

As described above, RC delay of the first global bit line GBL1 decreases as each of the plurality of first pre-charge circuits 22-1, 22-2, . . . is arranged between the plurality of sub arrays 21-1, 21-2, . . . , so the time needed for pre-charging the first global bit line GBL1 with a first pre-charge voltage VEXT and time needed for pre-charging it with a second pre-charge voltage VPRE decrease.

When each transistor BTR1 and BTR2 is turned on in response to each control signal VPBIASB and VBIAS at T3 for performing a developing operation, a third pre-charge voltage VPPSA is supplied to the first global bit line GBL1.

Accordingly, when a selected memory cell 13 is in an amorphous state as illustrated in FIG. 3 and a voltage of a first input terminal (+) of the sense amplifier S/A is higher than a reference voltage Vref, the sense amplifier S/A outputs a signal having a high level as an output signal.

When the selected memory cell 13 is in a crystal state and a voltage of the first input terminal (+) of the sense amplifier S/A is lower than the reference voltage Vref, the sense amplifier S/A outputs a signal having a low level as an output signal.

Figure 9A:
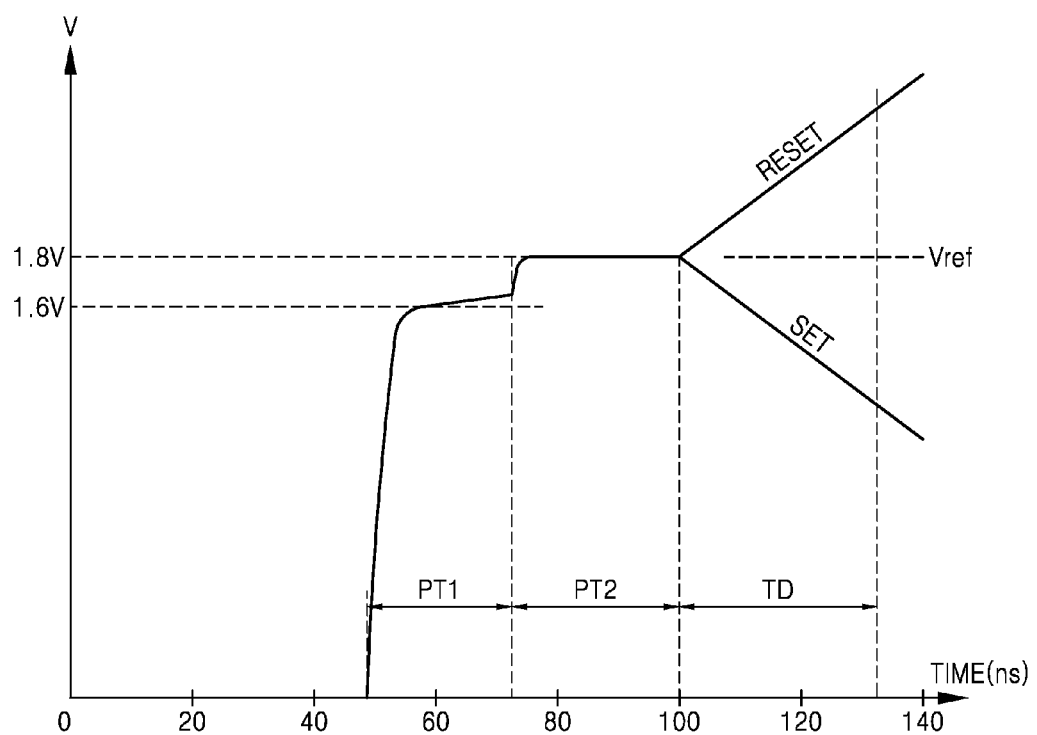
FIG. 9A is a timing diagram for explaining a pre-charge operation and a developing operation performed in a related art memory device.

FIG. 9A is a timing diagram for explaining a pre-charge operation and a developing operation performed in a related art memory device. In a related art memory device, unlike a memory device 10 illustrated in FIGS. 1 and 2, a plurality of first pre-charge circuits 22-1, 22-2, . . . , are not embodied between a plurality of sub arrays 21-1, 21-2, . . . .

The related art memory device pre-charges a selected global bit line with a first voltage, e.g., 1.6V, during a first pre-charge time PT1 by using a pre-charge circuit which is outside a memory cell array 20, and pre-charges the selected global bit line with a second voltage, e.g., 1.8V, one more time during a second pre-charge time PT2. Moreover, it supplies a third pre-charge voltage to the selected global bit line during a third pre-charge time TD so as to perform a developing operation.

A sense amplifier, which is connected to the selected global bit line depending on whether a phase change material included in a memory cell connected to the selected global bit line is in a crystal state or an amorphous state, outputs an output signal indicating if the memory cell is in a set state or a reset state.

Figure 9B:
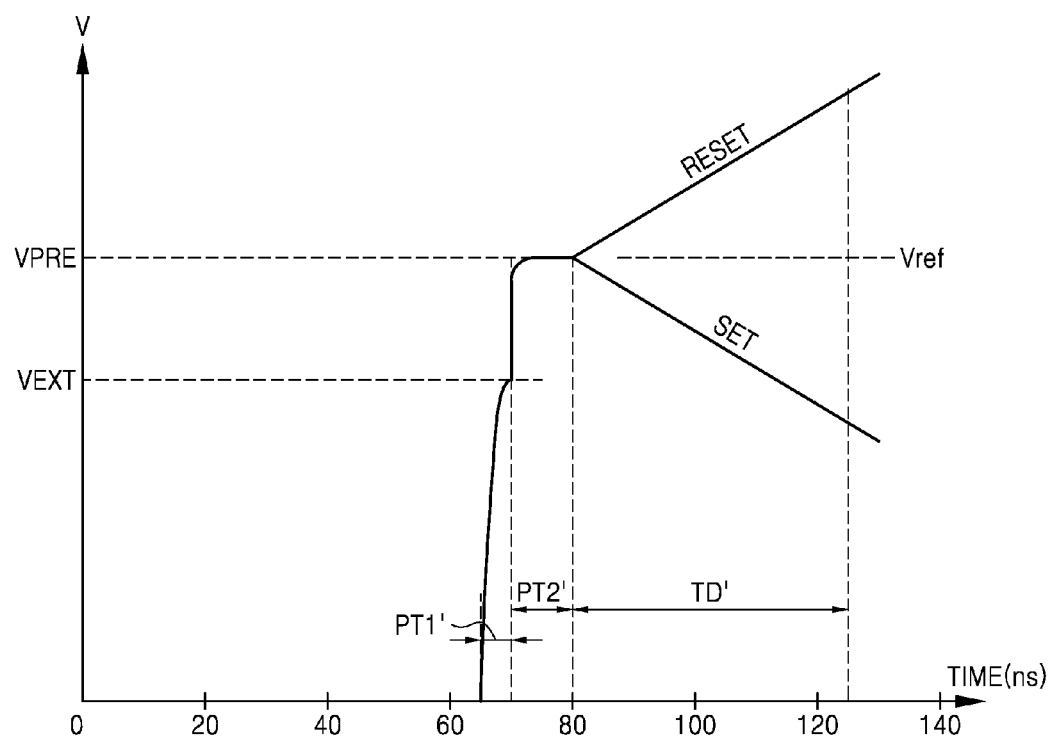
FIG. 9B is a timing diagram for explaining a pre-charge operation and a developing operation performed in the memory device illustrated in FIG. 1.

FIG. 9B is a timing diagram for explaining a pre-charge operation and a developing operation performed in the memory device illustrated in FIG. 1. As illustrated in FIGS. 1 and 2, as a plurality of first pre-charge circuits 22-1, 22-2, . . . are embodied between a plurality of sub arrays 21-1, 21-2, . . . , RC delay of a selected global bit line, e.g., the first global bit line GBL1, decreases.

Accordingly, a first pre-charge time for pre-charging the first global bit line GBL1 with a first pre-charge voltage VEXT, e.g., 1.6V, decreases from PT1 to PT1' (PT1'<PT1), and a second pre-charge time for pre-charging the first global bit line GBL1 with a second pre-charge voltage VPRE, e.g., 1.8V, decreases from PT2 to PT2' (PT2'<PT2).

Moreover, a third pre-charge voltage VPPSA is supplied to the first global bit line GBL1 during a third pre-charge time TD' to perform a developing operation.

The sense amplifier S/A, according to whether a phase change material included in a memory cell connected to the first global bit line GBL1 is in a crystal state or an amorphous state, outputs an output signal indicating if the memory cell is in a set state or a reset state. The sense amplifier S/A outputs an output signal by comparing a voltage of the first global bit line GBL1 connected to a first input terminal (+) with a reference voltage Vref.

As illustrated in FIGS. 2, 9A and 9B, a memory device 10 according to an exemplary embodiment may reduce each pre-charge time PT1' and PT2', so that it may reduce tRCD and a sensing time. Therefore, it may reduce a data read time.

Figure 10:
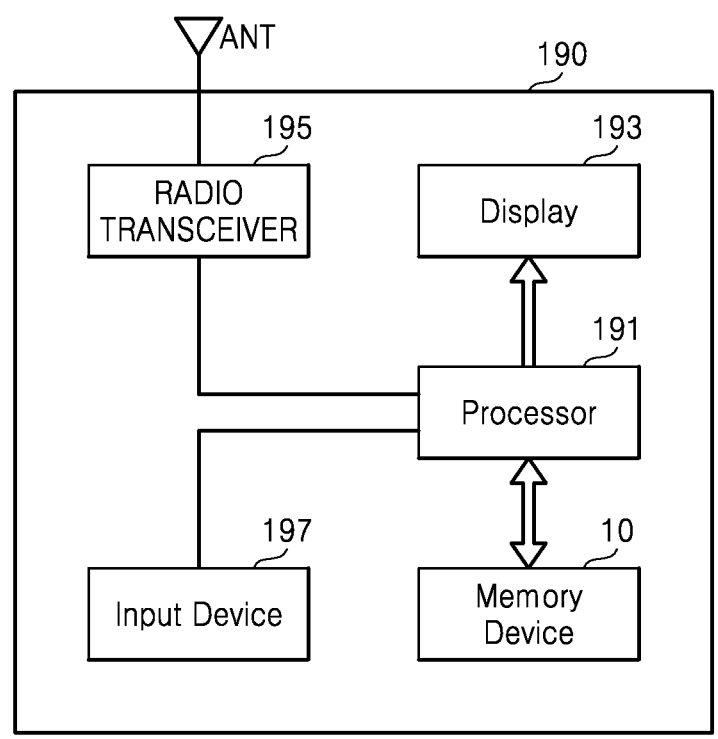
FIG. 10 shows an exemplary embodiment of an electronic device including the memory device illustrated in FIG. 1.

FIG. 10 shows an exemplary embodiment of an electronic device including the memory device illustrated in FIG. 1. Referring to FIG. 10, the electronic device 190 which may be embodied in a cellular phone, a smart phone, personal digital assistant (PDA), tablet personal computer, or a wireless internet device includes a memory device 10 and a processor 191 that controls the memory device 10.

Data stored in the memory device 10 may be displayed through a display 193 under a control of the processor 191.

A wireless transceiver 195 may exchange wireless signals through an antenna ANT. For example, the wireless transceiver 195 may change wireless signals received through the antenna ANT into signals which the processor 191 may process. Accordingly, the processor 191 may process signals output from the wireless transceiver 195, store processed signals in the memory device 10 or display them through a display 193. Additionally, the wireless transceiver 195 may change signals output from the processor 191 into wireless signals and output the wireless signals to outside through the antenna ANT.

An input device 197 is a device inputting control signals for controlling an operation of the processor 191 or data to be processed by the processor 191, and may be embodied in a pointing device such as a touch pad or a computer mouse, a keypad or a keyboard.

The processor 191 may control an operation of the display 193 so that data output from the memory device 10, wireless signals output from the wireless transceiver 195, or data output from the input device 197 may be displayed through the display 193.

Figure 11:
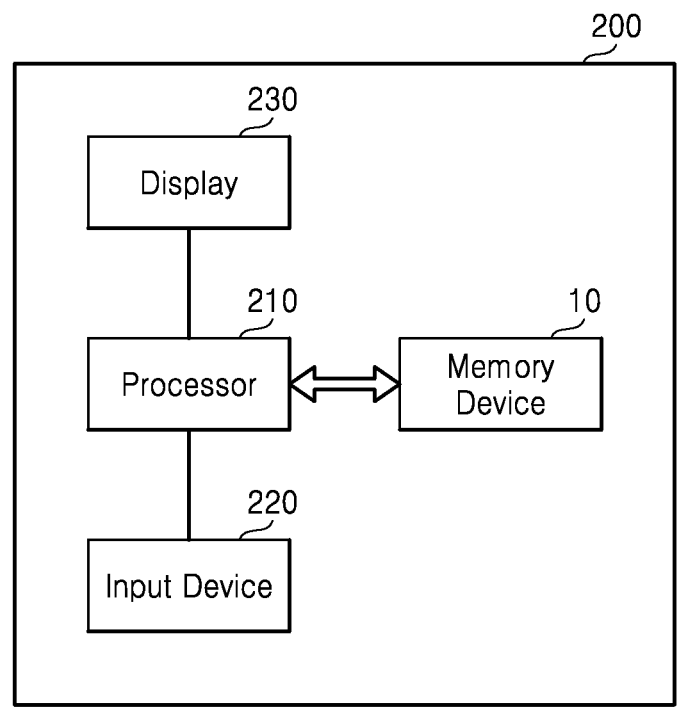
FIG. 11 shows another exemplary embodiment of an electronic device including the memory device illustrated in FIG. 1.

FIG. 11 shows another exemplary embodiment of an electronic device including the memory device illustrated in FIG. 1. Referring to FIG. 11, an electronic device 200 which may be embodied in a data processing device such as a personal computer (PC), a tablet PC, a net-book, a e-reader, a personal digital assistant (PDA), a portable multimedia player (PMP), a MP3 player or a MP4 player includes a memory device 10 and a processor 210 that controls an operation of the memory device 10.

The processor 210 may cause data stored in the memory device 10 to be displayed by the display 230 according to an input signal occurred by the input device 220. For example, the input device 220 may be embodied in a pointing device such as a touch pad or a computer mouse, a keypad or a keyboard.

Figure 12:
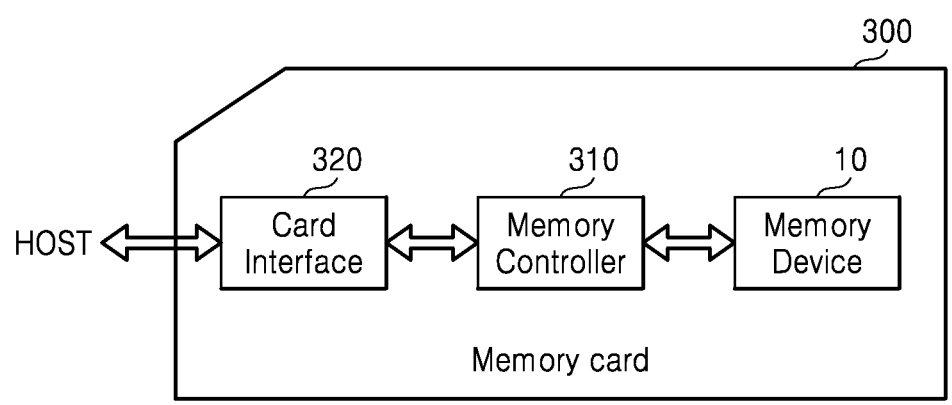
FIG. 12 shows still another exemplary embodiment of an electronic device including the memory device illustrated in FIG. 1.

FIG. 12 shows still another exemplary embodiment of the electronic device including the memory device illustrated in FIG. 1. Referring to FIG. 12, an electronic device 300, which may be embodied in a memory card or a smart card, includes a memory device 10, a memory controller 310 and a card interface 320.

A memory controller 310 may control exchange of data between the memory device 10 and a card interface 320. According to an exemplary embodiment, the card interface 320 may be a secure digital (SD) card interface or a multi-media card (MMC) interface, however, it is not restricted thereto. According to a communication protocol of a host which may communicate with an electronic device 300, the card interface 320 may interface data exchange between the host and the memory controller 310.

When an electronic device 300 is connected to a host such as a computer, a digital camera, a digital audio player, a cellular phone, a consol video game hardware or a digital set-top box, the host may exchange data stored in the memory device 10 through the card interface 320 and the memory controller 310.

Figure 13:
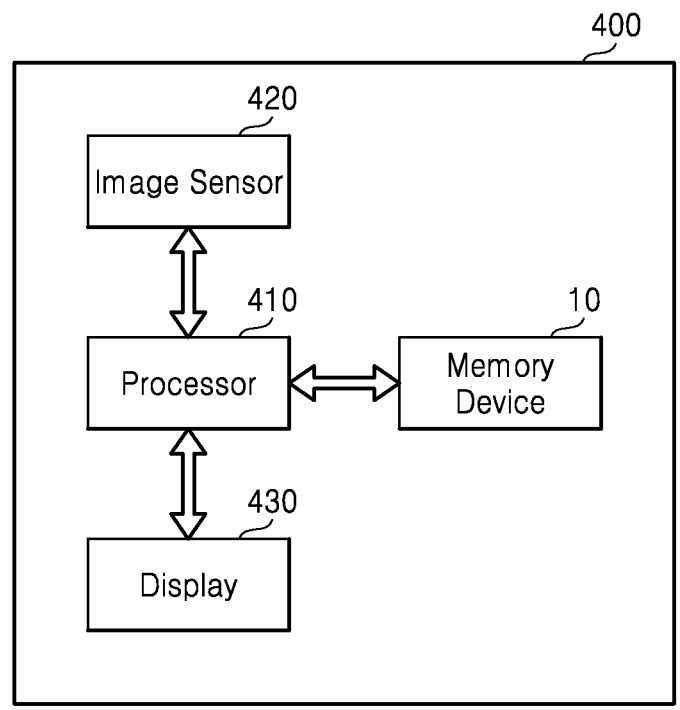
FIG. 13 shows still another exemplary embodiment of an electronic device including the memory device illustrated in FIG. 1.

FIG. 13 shows still another exemplary embodiment of an electronic device including the memory device illustrated in FIG. 1. Referring to FIG. 13, an electronic device 400 includes a memory device 10 and a processor 410 that controls a data processing operation of the memory device 10.

An image sensor 420 of the electronic device 400 converts an optical image into digital signals, and converted digital signals are stored in the memory device 10 or displayed through a display 430 under a control of the processor 410. In addition, the digital signals stored in the memory device 10 are displayed through the display 430 under a control of the processor 410.

Figure 14:
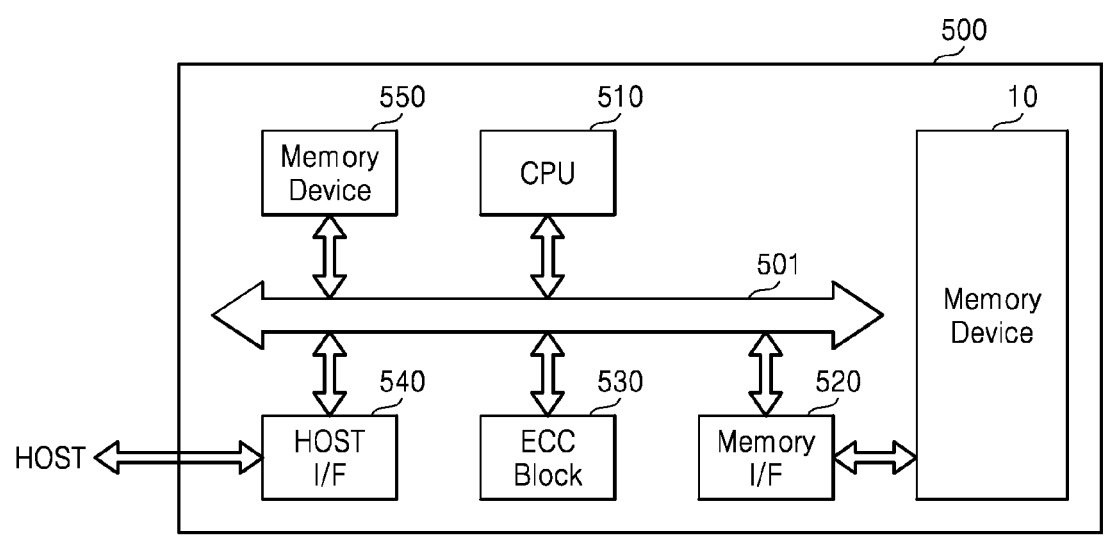
FIG. 14 shows still another exemplary embodiment of an electronic device including the memory device illustrated in FIG. 1.

FIG. 14 shows still another exemplary embodiment of an electronic device including the memory device illustrated in FIG. 1. Referring to FIG. 14, an electronic device 500 includes a memory device 10 and a CPU 510 that controls an operation of the memory device 10.

The electronic device 500 includes a memory device 550 which may be used as an operation memory of the CPU 510. The memory device 550 may be embodied in a non-volatile memory such as ROM.

A host connected to the electronic device 500 may exchange data with the memory device 10 through a memory interface 520 and a host interface 540.

An error correction code (ECC) block 530 operating under a control of the CPU 510 may detect and correct an error included in data read from the memory device 10 through the memory interface 520.

The CPU 510 may control data exchange between the memory interface 520, the ECC block 530, the host interface 540 and the memory device 550 through a bus 501. The electronic device 500 may be embodied in an universal serial bus (USB) memory drive or a memory stick.

Figure 15:
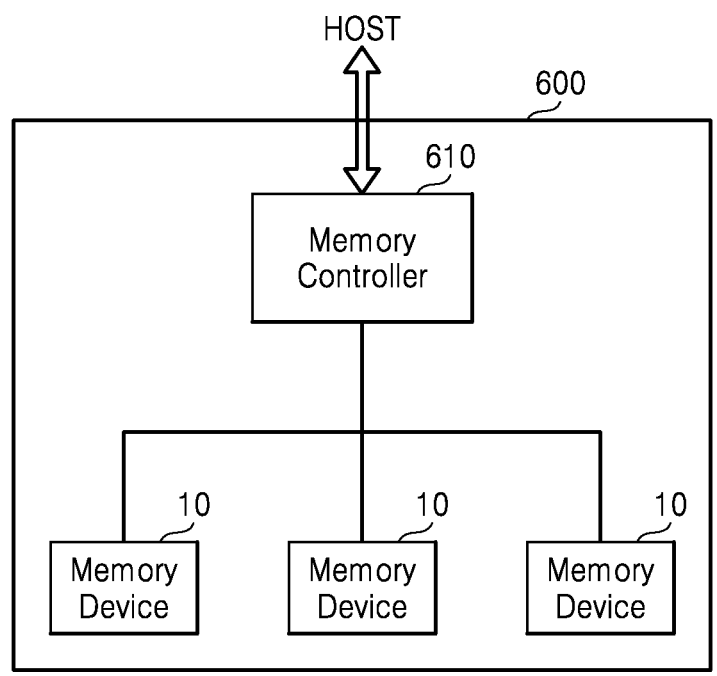
FIG. 15 shows still another exemplary embodiment of an electronic device including the memory device illustrated in FIG. 1.

FIG. 15 shows still another exemplary embodiment of an electronic device including the memory device illustrated in FIG. 1. Referring to FIG. 15, an electronic device 600 may be embodied in a data storage device such as a solid state drive (SSD). The electronic device 600 may include a plurality of memory devices 10, a memory controller 610 controlling a data processing operation of each of the plurality of memory devices 10. The electronic device 600 may be embodied in a memory system or a memory module. According to an exemplary embodiment, the memory controller 610 may be embodied inside or outside the electronic device 600.

Figure 16:
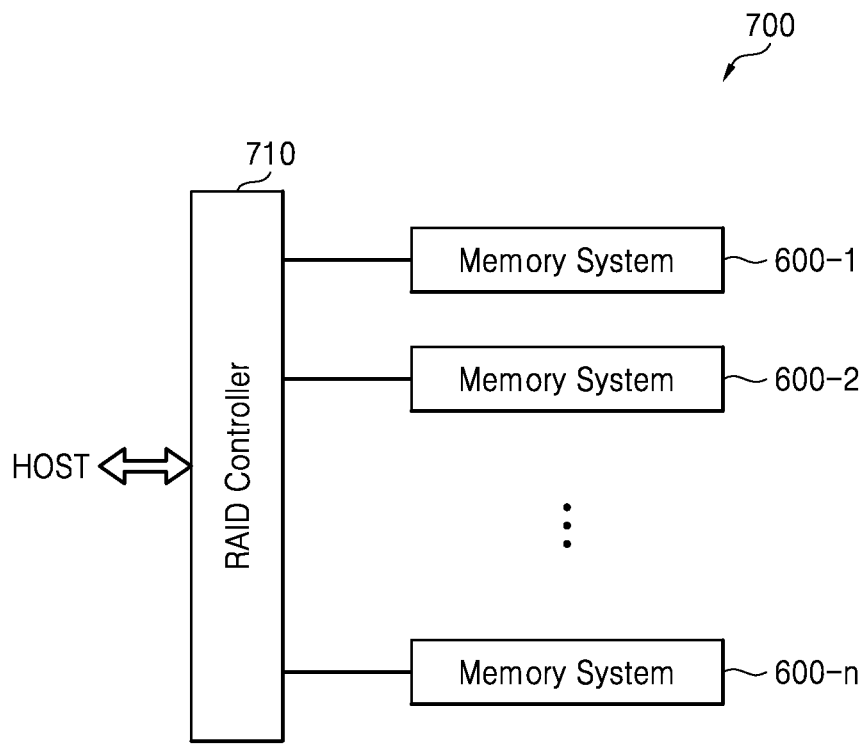
FIG. 16 shows an exemplary embodiment of a data processing device including the electronic device illustrated in FIG. 15.

FIG. 16 shows an exemplary embodiment of a data processing device including an electronic device illustrated in FIG. 15. Referring to FIGS. 15 and 16, a data storage device 700 which may be embodied in a redundant array of independent disks (RAID) system may include a RAID controller 710 and a plurality of memory systems 600-1 to 600-n, where n is a natural number.

Each of the plurality of memory systems 600-1 to 600-n may be the electronic device 600 illustrated in FIG. 15. The plurality of memory systems 600-1 to 600-n may compose a RAID array. A data storage device 700 may be embodied in a personal computer (PC) or a SSD.

During a program operation, the RAID controller 710 may output program data output from a host to one of the plurality of memory systems 600-1 to 600-n according to one of a plurality of RAID levels, which is selected based on RAID level information output from the host.

In addition, during a read operation, the RAID controller 710 may transmit data read from one of the plurality of memory modules 600-1 to 600-n to the host according to one of the plurality of RAID levels, which is selected based on RAID level information output from the host.

Figure 17:
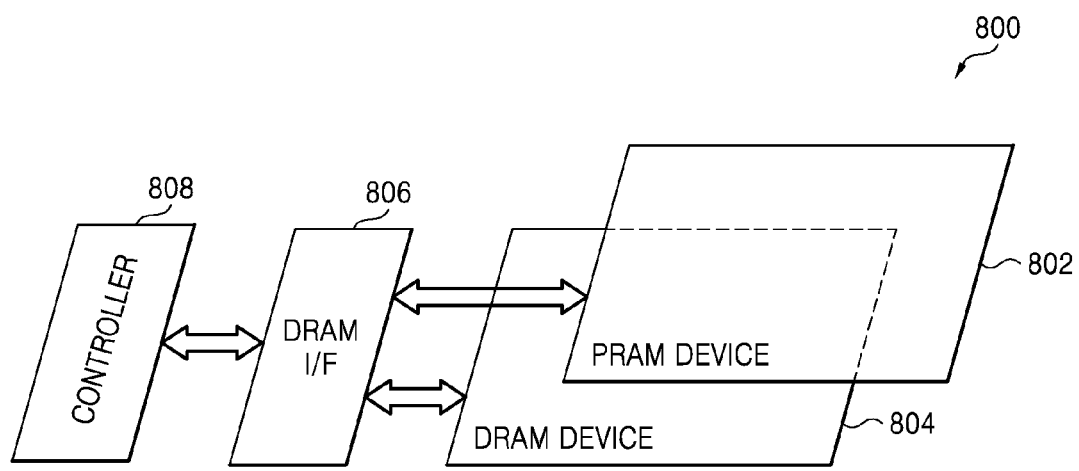
FIG. 17 shows still another exemplary embodiment of an electronic device including the memory device illustrated in FIG. 1.

FIG. 17 shows still another exemplary embodiment of an electronic device including the memory device illustrated in FIG. 1. Referring to FIG. 17, an electronic device 800 includes a first memory device 802 including a memory cell array including PRAM memory cells, a second memory device 804 including a memory cell array including DRAM memory cells and a DRAM interface 806. The first memory device 802 may be embodied in the memory device 10 illustrated in FIG. 1.

The first memory device 802 may be stacked on the second memory device 804. The first memory device 802 and the second memory device 804 may be embodied in a multi-chip package (MCP).

The first memory device 802 may exchange data with an external controller 808 through the DRAM interface 806. The second memory device 804 may exchange data with the external controller 808 through the DRAM interface 806.

Figure 18:
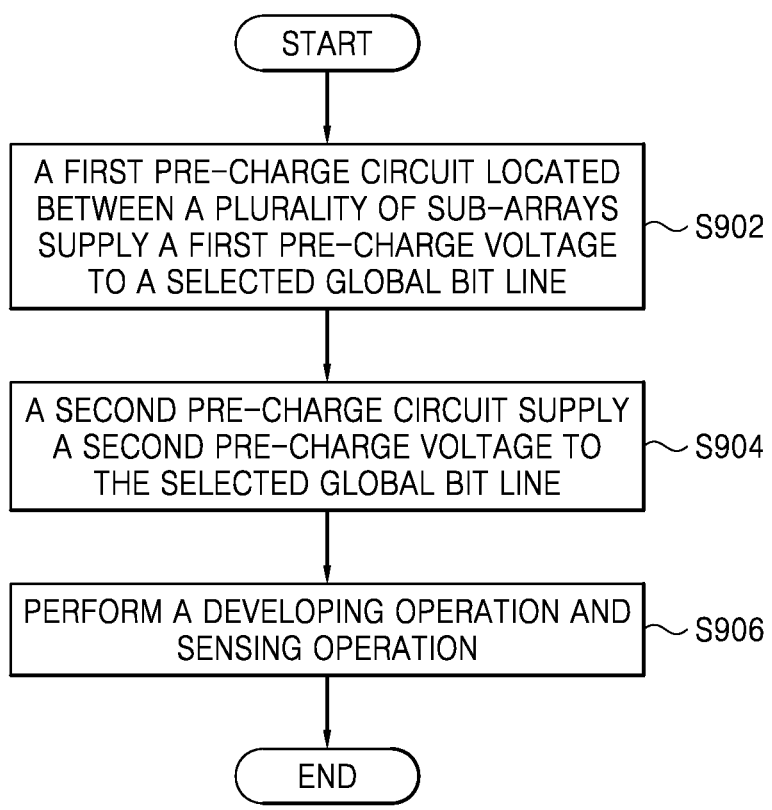
FIG. 18 is a flowchart showing a pre-charge voltage control method of the memory device according to an exemplary embodiment.

FIG. 18 is a flowchart showing a pre-charge voltage control method of a memory device according to an exemplary embodiment. Referring to FIGS. 1, 2, 8 and 18, a plurality of first pre-charge circuits 22-1, 22-2, . . . located between a plurality of sub arrays 21 embodied in a memory cell array 20 supplies a first pre-charge voltage VEXT to one (e.g., GBL1) of a plurality of global bit lines GBL1 to GBLm according to a first pre-charge enable signal Vpch1 at T1 (S902). As described above, RC delay of a global bit line (GBL1) decreases, so that the global bit line GBL1 is quickly pre-charged with the first pre-charge voltage VEXT.

A second pre-charge circuit 24 supplies a second pre-charge voltage VPRE to a global bit line (GBL1) according to a second pre-charge enable signal Vpch2 at T2 (S904).

When the first pre-charge voltage VEXT and the second pre-charge voltage VPRE are successively supplied to a selected global bit line (GBL1), the memory device 10 performs a developing operation for the selected global bit line (GBL1) by using a third pre-charge voltage VPPSA, and performs a sensing operation that senses and amplifies a voltage change of the selected global bit line (GBL1) by using a reference voltage Vref (S906). A global bit line pre-charge method according to an exemplary embodiment may be applied to a local bit line pre-charge method.

A memory device according to an exemplary embodiment and an electronic device having the same may reduce the RC delay of a selected global bit line by locating a pre-charge circuit between a plurality of sub arrays arranged in a memory cell array, so that they may reduce pre-charge time of the global bit line. Accordingly, the memory device may reduce tRCD and a data read time.

Although a few exemplary embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A global bit line pre-charge method of a memory device, the method comprising:
   pre-charging a first global bit line with a first pre-charge voltage by using at least a first pre-charge circuit located between a first sub array and a second sub array included in a memory cell array of the memory device; and
   after the pre-charging the first global bit line with the first pre-charge voltage, pre-charging the pre-charged first global bit line with a second pre-charge voltage which is higher than the first pre-charge voltage by using a second pre-charge circuit located outside the memory cell array.

2. The method of claim 1, wherein the pre-charging the first global bit line with the first pre-charge voltage comprises supplying an external voltage to the first global bit line as the first pre-charge voltage.

3. The method of claim 1, wherein the pre-charging the first global bit line with the first pre-charge voltage comprises clamping a current supplied by an external power supply and supplying a clamped current to the first global bit line by using the first pre-charge circuit.

4. The method of claim 1, wherein the first pre-charge voltage is regulated to obtain the second pre-charge voltage.

5. The method of claim 1, further comprising:
   pre-charging the first global bit line with a third pre-charge voltage by using a pre-charge voltage supply circuit.

6. The method of claim 1, wherein the pre-charging the first global bit line with the second pre-charge voltage comprises clamping a current supplied by a power supply and supplying a clamped current to the first global bit line.

7. A memory device comprising:
   a memory cell array including a plurality of sub arrays;
   a first pre-charge circuit disposed inside the memory cell array that pre-charges a first global bit line of a plurality of global bit lines with a first pre-charge voltage; and
   a second pre-charge circuit disposed outside the memory cell array that pre-charges the pre-charged first global bit line with a second pre-charge voltage which is higher than the first pre-charge voltage after the first pre-charge circuit pre-charges the first global bit line with the first pre-charge voltage.

8. The memory device of claim 7, wherein the first pre-charge circuit is arranged between a first sub array and a second sub array of the plurality of sub arrays.

9. The memory device of claim 7, further comprising:
   a voltage generator that receives an external voltage, regulates the external voltage, and outputs a regulated external voltage;
   wherein the first pre-charge circuit supplies the external voltage to the first global bit line as the first pre-charge voltage, and
   wherein the second pre-charge circuit supplies the regulated external voltage to the first global bit line as the second pre-charge voltage.

10. The memory device of claim 7, wherein the first pre-charge circuit clamps a current supplied from an external power supply and pre-charges the selected global bit line with the first pre-charge voltage by using a clamped current,
wherein the second pre-charge circuit clamps a current supplied from a regulator connected to the external power supply and pre-charges the selected global bit line with the second pre-charge voltage by using a clamped current.

11. The memory device of claim 7, further comprising a control logic that controls the first pre-charge circuit and the second pre-charge circuit so that the second pre-charge voltage is supplied to the first global bit line after the first pre-charge voltage is supplied to the first global bit line.

12. The memory device of claim 7, wherein the first pre-charge circuit comprises:
a first pre-charge voltage supply circuit that outputs the first pre-charge voltage according to a first pre-charge enable signal; and
a first clamp circuit that clamps a current, which is supplied to the first global bit line from the first pre-charge voltage supply circuit, according to a clamp control signal.

13. The memory device of claim 12, wherein the second pre-charge circuit comprises:
a second pre-charge voltage supply circuit that outputs the second pre-charge voltage according to a second pre-charge enable signal; and
a second clamp circuit that clamps a current, which is supplied to the first global bit line from the second pre-charge voltage supply circuit, according to the clamp control signal.

14. The memory device of claim 7, wherein the memory device is a phase change memory device.

15. The memory device of claim 7, further comprising:
a pre-charge voltage supply circuit that pre-charges the first global bit line with a third pre-charge voltage.

16. An electronic device comprising:
a memory device comprising:
a memory cell array including a plurality of sub arrays;
a first pre-charge circuit embodied inside the memory cell array that pre-charges a first global bit line of a plurality of global bit lines with a first pre-charge voltage; and
a second pre-charge circuit embodied outside the memory cell array that pre-charges the pre-charged first global bit line with a second pre-charge voltage which is higher than the first pre-charge voltage after the first pre-charge circuit pre-charges the first global bit line with the first pre-charge voltage; and
a processor that controls an operation of the memory device.

17. The electronic device of claim 16, wherein the memory device further comprises a control logic that controls the first pre-charge circuit and the second pre-charge circuit so that the second pre-charge voltage is supplied to the first global bit line after the first pre-charge voltage is supplied to the first global bit line.

18. The electronic device of claim 16, wherein the at least a first pre-charge circuit comprises:
a first pre-charge voltage supply circuit that outputs the first pre-charge voltage according to a first pre-charge enable signal; and
a first clamp circuit that clamps a current, which is supplied to the first global bit line from the first pre-charge voltage supply circuit, according to a clamp control signal.

19. The electronic device of claim 16, wherein the second pre-charge circuit further comprises:
a second pre-charge voltage supply circuit that outputs the second pre-charge voltage according to a second pre-charge enable signal; and
a second clamp circuit that clamps a current, which is supplied to the first global bit line from the second pre-charge voltage supply circuit, according to a clamp control signal.

20. The electronic device of claim 16, wherein the electronic device is a personal computer, a tablet personal computer, a solid state drive, or a cellular phone.

\* \* \* \* \*